(12) United States Patent
Chavan et al.

(10) Patent No.: US 6,828,172 B2
(45) Date of Patent: Dec. 7, 2004

(54) PROCESS FOR A MONOLITHICALLY-INTEGRATED MICROMACHINED SENSOR AND CIRCUIT

(75) Inventors: Abhijeet V. Chavan, Carmel, IN (US); James H. Logsdon, Kokomo, IN (US); Dan W. Chilcott, Greentown, IN (US); John C. Christenson, Kokomo, IN (US); Robert K. Speck, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 33 days.

(21) Appl. No.: 10/065,448

(22) Filed: Oct. 18, 2002

(65) Prior Publication Data

US 2003/0148620 A1 Aug. 7, 2003

Related U.S. Application Data

(60) Provisional application No. 60/354,589, filed on Feb. 4, 2002.

(51) Int. Cl.[7] .................... H01I 21/00; H01L 21/302
(52) U.S. Cl. ...................... 438/50; 438/53; 438/756
(58) Field of Search .................. 438/50–57, 89–94, 438/702, 756; 257/82, 254, 414–417, 467, 930

(56) References Cited

U.S. PATENT DOCUMENTS

| | | | |
|---|---|---|---|
| 5,059,543 A | | 10/1991 | Wise et al. .................. 437/3 |
| 5,100,479 A | * | 3/1992 | Wise et al. .................. 136/225 |
| 5,470,797 A | * | 11/1995 | Mastrangelo ............... 438/53 |
| 5,515,735 A | * | 5/1996 | Sarihan ...................... 73/861.47 |
| 5,689,087 A | | 11/1997 | Jack ........................... 136/213 |
| 5,883,310 A | * | 3/1999 | Ho et al. .................... 73/766 |
| 5,914,507 A | * | 6/1999 | Polla et al. ................. 257/254 |
| 5,982,014 A | | 11/1999 | Paige ........................ 257/467 |
| 5,994,188 A | | 11/1999 | Disney |
| 6,109,113 A | * | 8/2000 | Chavan et al. ............. 73/718 |
| 6,127,701 A | | 10/2000 | Disney |
| 6,294,787 B1 | * | 9/2001 | Schieferdecker et al. ... 250/349 |
| 6,369,646 B1 | | 4/2002 | Kesler et al. |
| 6,472,243 B2 | * | 10/2002 | Gogoi et al. ............... 438/50 |
| 6,525,880 B2 | * | 2/2003 | Flanders et al. ........... 359/578 |
| 6,631,638 B2 | * | 10/2003 | James et al. ............... 73/204.26 |

* cited by examiner

*Primary Examiner*—Michael Lebentritt
(74) *Attorney, Agent, or Firm*—Stefan V. Chmielewski

(57) ABSTRACT

A process using integrated sensor technology in which a micromachined sensing element and signal processing circuit are combined on a single semiconductor substrate to form, for example, an infrared sensor. The process is based on modifying a CMOS process to produce an improved layered micromachined member, such as a diaphragm, after the circuit fabrication process is completed. The process generally entails forming a circuit device on a substrate by processing steps that include forming multiple dielectric layers and at least one conductive layer on the substrate. The dielectric layers comprise an oxide layer on a surface of the substrate and at least two dielectric layers that are in tension, with the conductive layer being located between the two dielectric layers. The surface of the substrate is then dry etched to form a cavity and delineate the diaphragm and a frame surrounding the diaphragm. The dry etching step terminates at the oxide layer, such that the diaphragm comprises the dielectric layers and conductive layer. A special absorber is preferably fabricated on the diaphragm to promote efficient absorption of incoming infrared radiation.

20 Claims, 4 Drawing Sheets

PROCESS FOR A MONOLITHICALLY-INTEGRATED MICROMACHINED SENSOR AND CIRCUIT

CROSS REFERENCE TO RELATED APPLICATIONS

This application claims the benefit of U.S. Provisional Application No. 60/354,589, filed Feb. 4, 2002.

BACKGROUND OF INVENTION

1. Field of the Invention

The present invention generally relates to micromachined sensors. More particularly, this invention relates to a process for forming a monolithically-integrated sensor comprising a micromachined transducer and sensing circuitry combined on a single silicon substrate.

2. Description of the Related Art

Integrated micromachined sensors are generally fabricated using a post-processing approach, in which the micromachined features are formed by etching after the processing circuitry is fabricated. Wet anisotropic etch techniques have typically been used to define recesses and release membranes of micromachined features. However, wet anisotropic etching requires significant horizontal margins because etching occurs along the planes of the silicon wafer at a 54.7 degree angle. As a result, die size must be increased to allow for sufficient device tolerances, with the disadvantage that integrated micromachined sensors are not as compact as might be desired.

Another limitation associated with existing micromachined sensors integrated with CMOS (complementary metal oxide semiconductor) and BiCMOS (bipolar and complementary metal oxide semiconductor) processes is that dielectric layers utilized in such processes are in compression due to adhesion requirements on metal layers and long-term reliability. However, there exists the potential for significant yield loss in dielectric isolated structures, such as micromachined diaphragms, due to wrinkling caused by the compressive stresses within such dielectric layers.

SUMMARY OF INVENTION

The present invention is a process using integrated sensor technology in which a micromachined sensing element and CMOS or BiCMOS signal processing circuits are combined on a single semiconductor substrate, in which the process steps provide a more compact sensor and improved yields as compared to previous integrated micromachined sensors. The process is based on modifying a BiCMOS or CMOS process to produce an improved layered micromachined member, such as a sensor diaphragm, after the circuit fabrication process is completed. Compressive stresses within the composite layer of the micromachined member are significantly reduced or eliminated to improve yields. The process is well suited for the fabrication of micromachined thermopile transducers for use as infrared sensors, though other types of micromachined sensors are foreseeable and within the scope of this invention.

Generally, the process of this invention entails forming a circuit device on a substrate by processing steps that include forming multiple dielectric layers and at least one conductive layer on the substrate. The multiple dielectric layers comprise an oxide layer on a surface of the substrate and at least two other dielectric layers that are in tension, with the conductive layer being located between the two dielectric layers. The surface of the substrate is then dry etched to form a cavity therein and thereby delineate a micromachined member and a frame surrounding the micromachined member. The dry etching step terminates at the oxide layer, such that the micromachined member comprises the multiple dielectric layers and the conductive layer.

As described above, the process of this invention is able to produce a sensor characterized by reduced signal noise as a result of the sensing (micromachined) member being fabricated on the same chip as its signal processing circuitry, thereby minimizing the distance that the transducer signal must be transmitted. Fabrication of the sensor structure does not require high dopant concentrations, thermal treatments or other processing steps that would be incompatible with standard BiCMOS and CMOS devices, such that the signal processing circuitry can make use of CMOS and BiCMOS technology. The sensor also does not require the use of materials and process steps that are not conducive to mass production processes made possible with CMOS technology.

In addition to the above, the process of this invention results in stresses within the deposited layers being effectively tensile after the completion of the IC fabrication process. More particularly, the process of this invention forms tensile films both above and below the conductive layer to provide good adhesion while converting to tensile the net stress in the composite dielectric stack, such that the potential is reduced for yield losses attributable to compressive stresses within the dielectric stack. According to another aspect of the invention, the dry etch provides various advantages, including producing walls normal to the etched surface so as to reduce the size of the die required to accommodate the integrated micromachine.

Other objects and advantages of this invention will be better appreciated from the following detailed description.

DETAILED DESCRIPTION

Micromachined sensors produced by processes of this invention are illustrated in the Figures as thermopile transducers suitable for use as infrared sensors, though other types of micromachined sensors are foreseeable and within the scope of this invention. Processes relating to two embodiments of this invention are described below. A first of the embodiments is a front-side-up device represented in FIG. 1, intended for wirebonding within a package. The second embodiment is a front-side-down device represented in FIG. 5, intended to be surface-mounted within a package by solder bumping and reflow.

Figure 1:
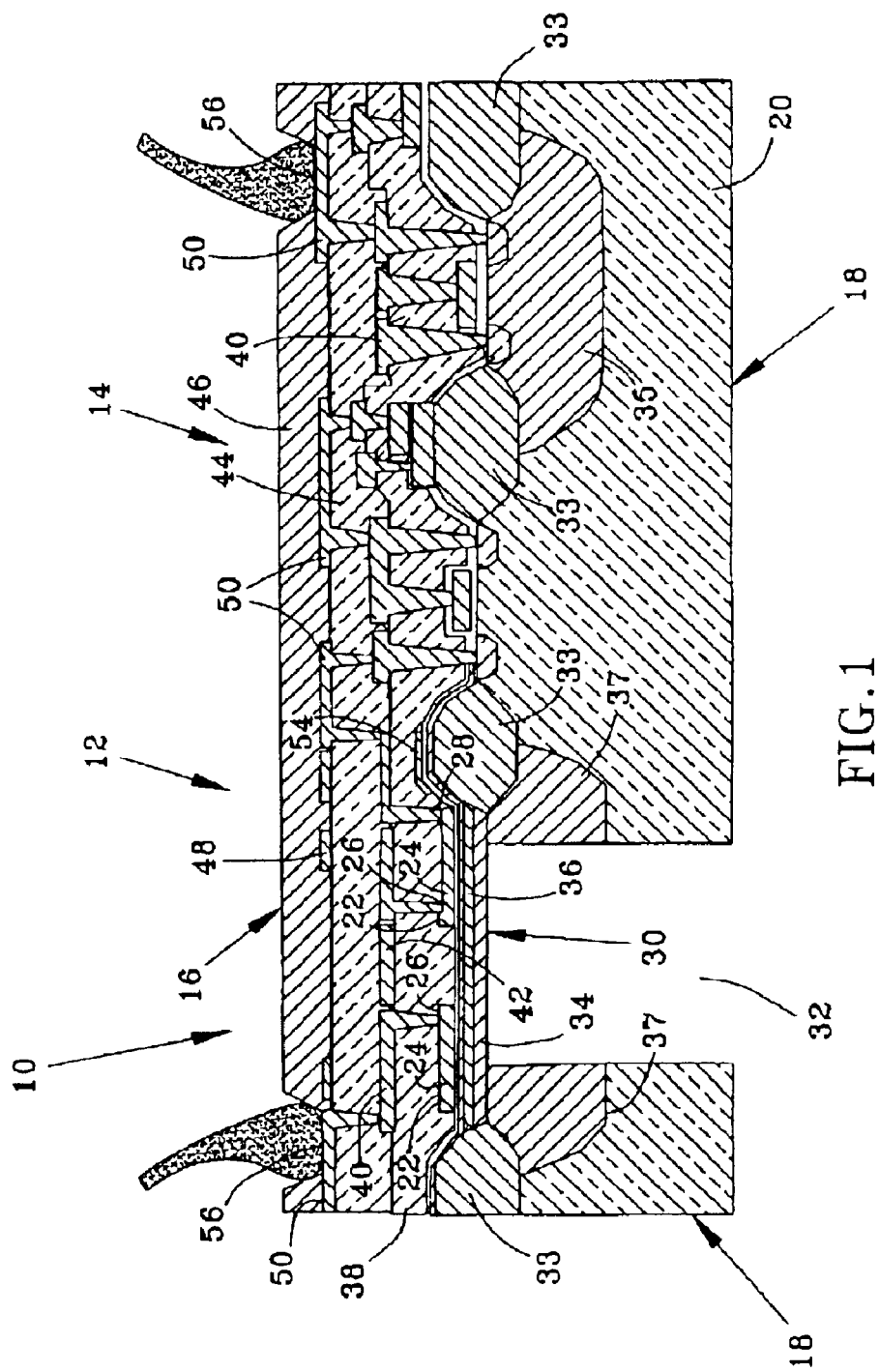
FIG. 1 represents a cross-section of a thermopile-based micromachined sensor that can be produced using a process in accordance with a first embodiment of the invention.

With reference to FIG. 1, an infrared sensor 10 is shown comprising a thermopile transducer 12 and a signal processing circuitry 14 on a silicon substrate 20, which may be formed of undoped or lightly-doped (i.e., not heavily doped) single-crystal silicon or another suitable semiconductor material. The sensor 10 is depicted as being of a type disclosed in co-pending U.S. patent application Ser. No. 10/065,447, which is incorporated herein by reference. The thermopile transducer 12 is supported on a thin membrane, or diaphragm 16, surrounded by a support frame 18 formed by the substrate 20. The signal conditioning circuitry 14 is represented as comprising a complementary metal-oxide-semiconductor (CMOS) device fabricated on the frame 18 to provide on-chip interface/compensation circuitry for the output of the transducer 12. Notably, the substrate 20 is undoped or lightly-doped because a heavily-doped substrate would be incompatible with the CMOS process used in the present invention.

The diaphragm 16 and frame 18 are shown as supporting a pair of thermopiles 22, each comprising a series of thermocouples 24. According to U.S. patent application Ser. No. 10/065,447, the thermocouples 24 of one thermopile 22 preferably alternate with the thermocouples 24 of the second thermopile 22, such that the thermopiles 22 are interlaced. Each thermocouple 24 has a pair of junctions, referred to as hot and cold junctions 26 and 28, respectively, formed by dissimilar electrically-resistive materials. The dissimilar materials are preferably aluminum and, as will be discussed in greater detail below, p-type polysilicon (polysilicon legs are shown in FIG. 1), though other materials could be used. The thermocouples 24 have their cold junctions (CJ) 28 on the frame 18 and their hot junctions (HJ) 26 on the diaphragm 16, which is adapted for absorption of infrared radiation and preferably composed of multiple layers of dielectric materials, polysilicon and metals, at least some of which enhance infrared and heat absorption. When the diaphragm 16 is exposed to infrared radiation, these layers absorb the radiation and raise the temperature of a central heat-absorption zone 30 of the diaphragm 16 above that of the surrounding area of the diaphragm 16. This, coupled with the heat loss to the support frame 18, creates a temperature gradient from the center of the sensor 10 to the edge of the diaphragm 16, causing the thermocouples 24 to produce a measurable output voltage, or Seebeck potential, from the thermopiles 22.

The signal processing circuitry 14 for the thermopile-based transducer 22 is located on the support frame 18 where the cold junctions 28 of the thermopiles 22 are located. As illustrated, signal conditioning is done by a CMOS circuit that provides a gain to the incoming signal and also converts it into a single-ended analog and/or digital output. A metallization layer 40 (Metal-1) contacts the hot and cold junctions 26 and 28 through vias defined in a dielectric layer 38. In combining the processes to fabricate the transducer 12 and circuitry 14, the metallization layer 40 is preferably deposited and patterned to also define the metallization for the circuitry 14. As shown in FIG. 1, a second metallization layer 50 (Metal-2) interconnects the metallization layer 40 with the signal processing circuitry 14. The metallization layers 40 and 50 can be formed of, for example, Al-1% Si or another suitable metallization alloy, and have a thickness of, for example, about 6000 Angstroms. The dielectric layer 38 may comprise a layer of phosphosilicate glass (PSG) or low temperature oxide (LTO), and may have a thickness of, for example, about 3000 Angstroms. The dielectric layer 38 also preferably includes a layer of spin-on glass (SOG) (e.g., about 800 Angstroms) for planarizing.

The fabrication process for the sensor 10 shown in FIG. 1 starts with a circuit process to create the bipolar and CMOS devices on the wafer substrate 20. Such processes are well known in the art, and therefore will not be described in any detail. In a p-type substrate 20 such as that of FIG. 1, the gate polysilicon of a CMOS device is typically ntype in order to minimize the amount of processing required to obtain the desired threshold. Therefore, n-type polysilicon has been used in the majority of CMOS processes. In the past, the gate electrode polysilicon of a CMOS device would also be used to form one leg of a thermopile fabricated simultaneously with the CMOS device. It is preferable to use p-type polysilicon since it has a higher Seebeck coefficient compared to n-type polysilicon. However, conventional practice would require special processing to produce p-type polysilicon for a thermopile fabricated in an n-type transistor gate polysilicon process. In contrast to conventional practice, the present invention uses a second level polysilicon layer that is selectively doped p-type as one leg of each thermocouple 24 (FIG. 1). As a result, the sensor 10 in FIG. 1 has a combination of an ntype CMOS gate electrode (Poly-1) 54 and thermopiles 22 with p-type polysilicon legs in the same circuit. The p-type polysilicon has a higher thermoelectric coefficient than n-type polysilicon, and thus promotes the sensitivity of the sensor 10. The operational benefits are thermopiles 22 that exhibit higher sensitivity and appropriate thresholds with minimum processing of the CMOS device.

Figure 2:
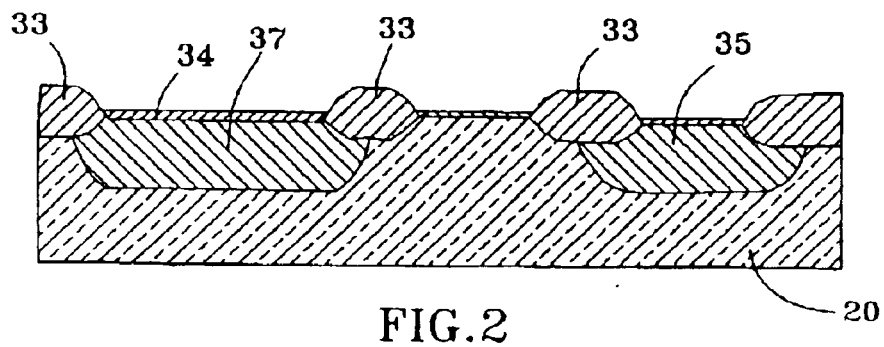
FIGS. 2 and 3 represent two processing steps in the fabrication of the sensor represented in FIG. 1.

In general, CMOS circuit processes tend to deposit dielectric layers having a net compressive stress after completion of the process. The circuit process of this invention is modified such that stresses in the deposited layers are effectively tensile after the completion of the circuit process. One preferred aspect for achieving this result is to reduce the thicknesses of compressive layers in the diaphragm 16. One of the biggest contributors to compressive stress within a deposited structure of the type shown in FIG. 1 is a field oxide layer, which is typically the lowermost layer in the dielectric stack of a sensor diaphragm. A field oxide layer having a thickness of about 0.7 $\mu$m to about 1 $\mu$m is typically required as an etch-stop during the final wet chemical anisotropic etch conventionally performed to define a sensor diaphragm. However, the present invention uses a thinner thermal oxide layer 34 as the lowermost layer in the dielectric stack. FIG. 2 shows an approximately 0.3 $\mu$m-thick thermal oxide layer 34 that was grown during drive-in of the n-well 35 of the PMOS transistor and a second n-type region 37 formed in the surface of the substrate 20 on which multiple layers of the diaphragm 16 will be deposited. The thermal oxide layer 34 is sufficiently thick to serve as an etch-stop when dry etching the substrate 20 to form a cavity 32 that delineates the multilayered diaphragm 16 (FIG. 1). Importantly, the n-well 37 (whose midsection is removed during etching of the cavity 32) provides the surface area in the BiCMOS process flow where the thermal oxide layer 34 can be grown. The n-well 37 can be electrically biased to reduce noise coupling from within the substrate 20 to the thermopiles 22. A thick field oxide layer 33 is shown as forming a rim around the diaphragm 16.

Figure 3:
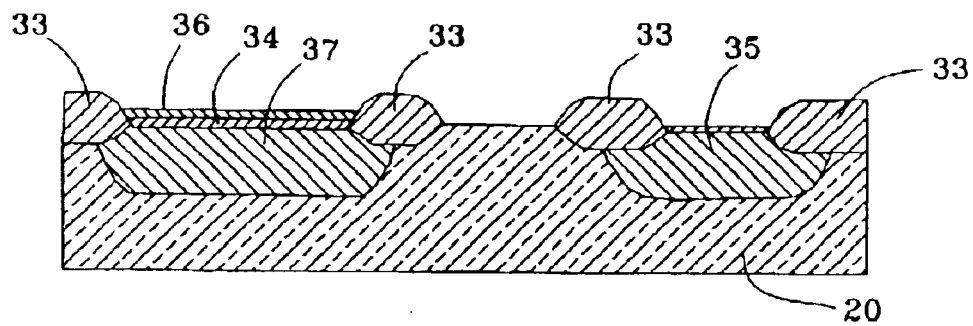

Yet another aspect of the circuit process of this invention relates to forming tensile films in the diaphragm 16 both above and below the metallization layers 40 and 50 (Metal-1 and Metal-2) so as to convert to tensile the net stress in the composite dielectric stack, while achieving good adhesion with the metallization layers 40 and 50. A first of these tensile films is preferably a low pressure (LP) nitride film 36, preferably about 0.2 to 0.4 $\mu$m in thickness, which is deposited and patterned after growing the thermal oxide layer 34 as represented in FIG. 3. The nitride film 36 is preferably deposited by chemical vapor deposition (CVD) prior to depositing the metallization layers 40 and 50. A second tensile film shown in FIG. 1 is an approximately 1.2 to 2 μm-thick layer of oxynitride 46 deposited over the second level metallization layer 50 (Metal-2). In addition to its ability to be deposited as a tensile film, the oxynitride layer 46 is an infrared-absorbing dielectric material and therefore promotes heat absorption in the central heat-absorption zone 30. The thicknesses and the stacking sequence of these dielectric layers 36 and 46 above and below the patterned metallization layers 40 and 50 of the integrated sensor 10 are important to achieving the tensile stresses in the micromachined portion (diaphragm 16) of the sensor 10, which in turn improves yields.

Figure 4:
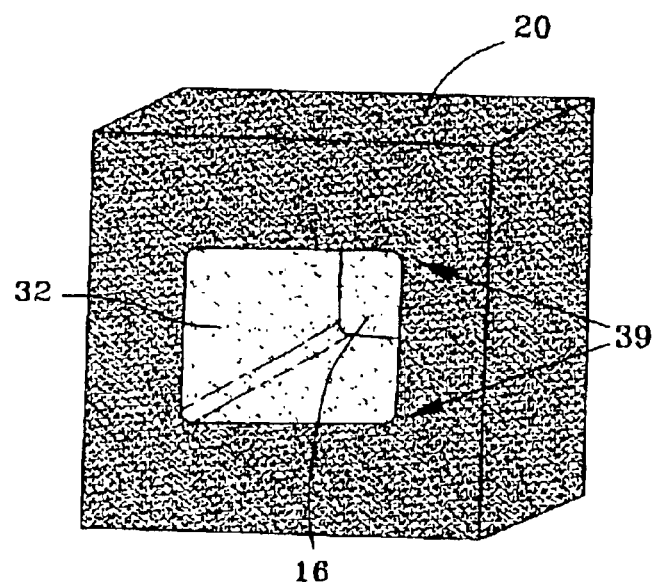
FIG. 4 is a perspective view illustrating the rounding of etched corners produced in accordance with a preferred aspect of this invention.

Another important aspect of the process of this invention is the use of a dry release etch from the backside of the substrate 20 to form the diaphragm 16 and cavity 32, as opposed to a wet chemical etch typically used in the past. A dry release etch provides a significant area advantage over a wet chemical etch as a result of being anisotropic in nature, thereby producing walls normal to the etched surface and reducing the size of the die required to accommodate the integrated micromachine. In addition, wet chemical etches can cause unpredictable yield loss and reliability problems in such integrated sensors which have circuits merged with sensors on the same substrate. A dry etching process used by the present invention to produce rounded corners 39 on the backside etch cavity 32, as portrayed FIG. 4. Rounding the corners 39 of the cavity 32 has the effect of further reducing stresses within the diaphragm, thereby increasing the yield of the dry etch process. Rounded corners 39 also allow for a more uniform dry etch across the diaphragm area, requiring less over-etch to clear silicon out of the corners of the diaphragm area. The etched cavity 32 and its rounded corners 39 can be produced by appropriately masking the lower surface of the substrate 20 prior to performing the dry etch process. A preferred dry etch technique is deep reactive ion etching DRIE as is known in the art, though it is foreseeable that other dry etch techniques could be used.

Other preferred layers and structures within the sensor 10 shown in FIG. 1 include an absorber/reflector metal 42 within the central heat-absorption zone 30 and located below the oxynitride layer 46 and a second dielectric layer 44. Similar to oxynitride, the second dielectric layer 44 is preferably formed of an infrared absorption dielectric material, such as a tetra-ethyl-ortho-silicate (TEOS) deposited oxide. In a preferred embodiment, the TEOS-based oxide layer 44 has a thickness of about 16,000 Angstroms. The absorber/reflector metal 42 can be deposited and patterned with the metallization layer 40 (Metal-1), and therefore also formed of Al-1% Si or another suitable metallization alloy. Alternatively, the absorber/reflector metal 42 can be deposited and patterned separately from the metallization layer 40, which would permit the metal 42 to be formed of another suitable material, such as W—Si. The absorber/reflector metal 42 serves to reflect any unabsorbed radiation (i.e., traveling downward toward the cavity 32) back toward the infrared absorbing dielectric layers 44 and 46. The combination of the absorber/reflector metal 42 below infrared absorbing dielectric layers 44 and 46 formed of oxynitride and a TEOS-based oxide provide good absorption (greater than 50%) of radiation of wavelengths of about eight to about fifteen micrometers, and good transmission (greater than 80%) for other wavelengths, creating what can be termed a thermal filter whereby heating of the diaphragm 16 can be proportional to a first order to the absorbed wavelengths only.

As shown in FIG. 1 the sensor 10 also preferably has a metal rim 48, which as shown can be deposited and patterned with the second metallization layer 50. The rim 48 is preferably patterned so that, in terms of alignment in the direction of radiation transmission through the diaphragm 16, the rim 48 overlaps the boundary between the diaphragm 16 and the surrounding frame 18, i.e., aligned with the edge defined by the cavity 32 in the substrate 20. In this manner, the rim 48 masks the edge variation from device to device, reducing temperature variation from one cold junction 28 to another. Thus the rim 48 promotes consistent behavior of the thermopiles 22 irrespective of any etching variations that might be introduced by the fabrication process.

Those skilled in the art will appreciate that, aside from the selection, location and deposition technique of the layers that form the diaphragm 16 and the etch technique employed to define the cavity 32, the sensor 10 shown in FIG. 1 can be fabricated using conventional CMOS processing techniques. Therefore, the steps required to form the diffused regions in the substrate 20 and deposit and pattern the layers of the sensor 10 on the substrate surface need not be discussed in any detail here. Following fabrication and singulation, the sensor 10 represented in FIG. 1 can be mounted in industry standard metal or ceramic IC packages. As shown in FIG. 1, the sensor 10 is adapted for connection to a package by wire-bonding to bond pads 56 formed on exposed regions of the second metallization layer 50.

Figure 5:
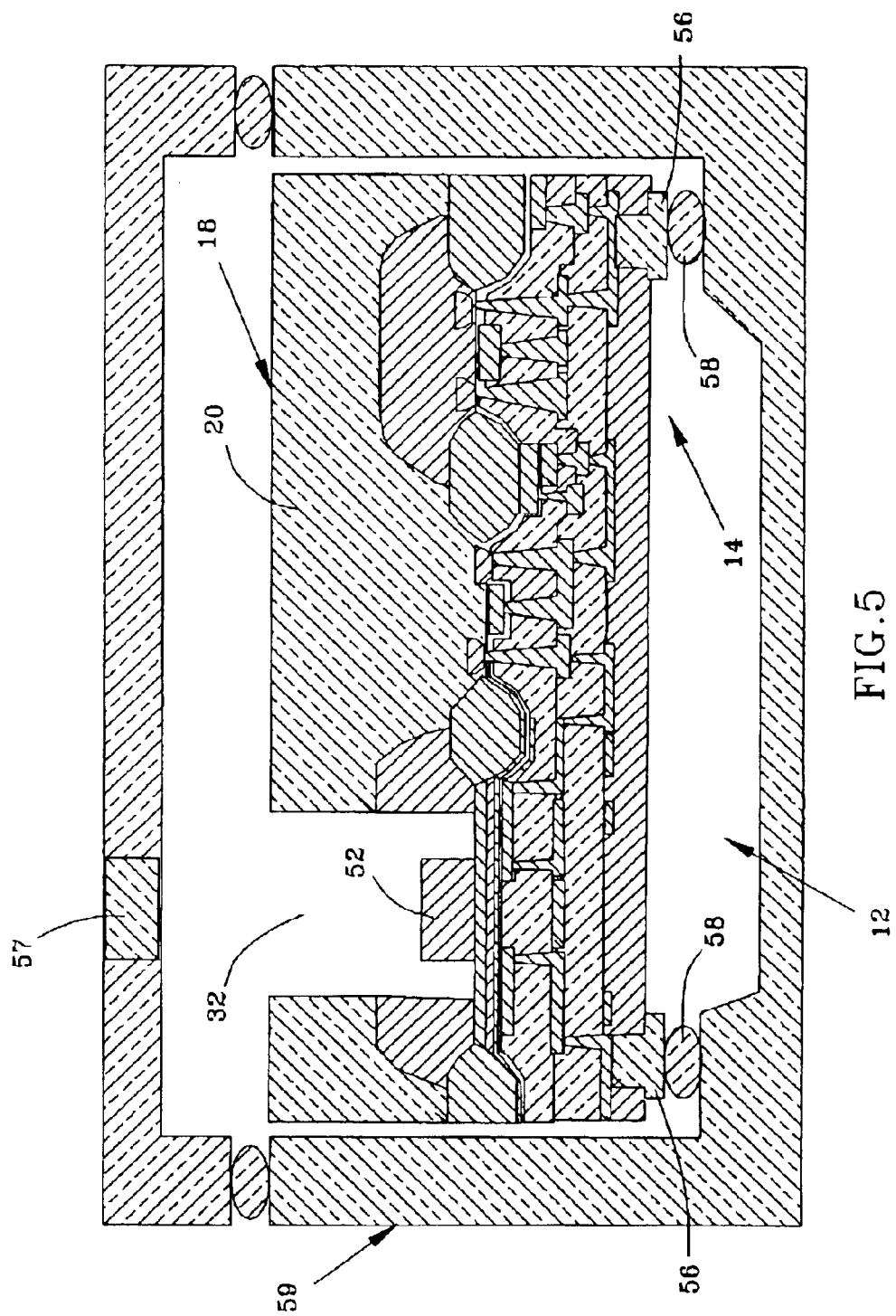
FIG. 5 represents a cross-section of a thermopile-based micromachined sensor that can be produced using a process in accordance with a second embodiment of the invention.
Figure 6:
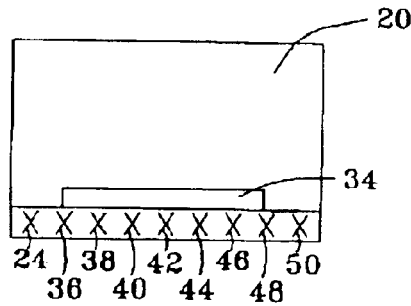
FIGS. 6 through 10 represent a first series of processing steps in the fabrication of the sensor represented in FIG. 5.

A front-side-down bumped sensor 110 of this invention is represented in FIG. 5, which uses the same reference numbers for the same sensor components described in reference to FIG. 1. The fabrication process for the sensor 110 includes all the earlier mentioned process details for the front-side-up sensor 10, with some additional process steps. One additional process is to form solder bumps 58 on front-side bond pads 56 to allow the sensor 110 to be mounted circuit side-down within an industry-standard metal or ceramic IC package 59. An advantage of this orientation is that additional focal distance (e.g., about 0.5 mm) can be provided for incoming infrared radiation, which impinges the diaphragm 16 through the cavity 32 after passing through an optical window and lens 57 in the package 59. The additional focal length permits the package 59 to be lower in height and therefore less expensive and easier to assemble on system boards.

Another additional process for the sensor 110 shown in FIG. 5 is the fabrication of a special absorber 52 on the backside of the sensor 110, again after the circuit fabrication process is completed on the front side of the sensor wafer. The absorber 52 is created using one of two subsequent process steps represented in FIGS. 6 through 10 or 11 through 12, in which a portion of the backside surface of the diaphragm 16 is etched to form a region of black silicon as the absorber 52. Black silicon, also known as silicon grass, can be formed by changing the silicon etch conditions to allow for micromasking during the dry etch process by which the cavity 32 is formed. As known in the art, black silicon has a conical microstructure, and as a result of this morphology is able to absorb a large percentage of incident radiation. This promotes efficient absorption of incoming infrared radiation by the absorber 52, thereby generating a larger sensor signal and improving signal-to-noise ratio.

Figure 10:
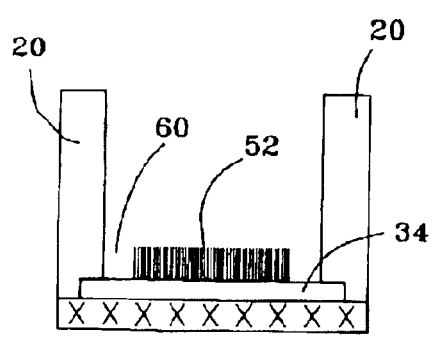
Figure 7:
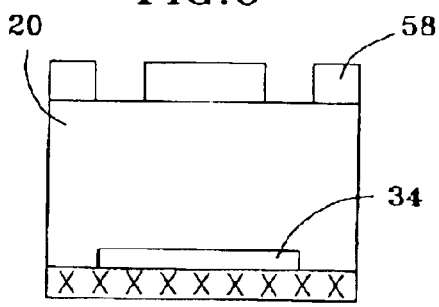
Figure 8:
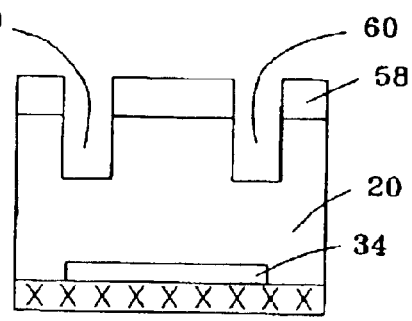
Figure 9:
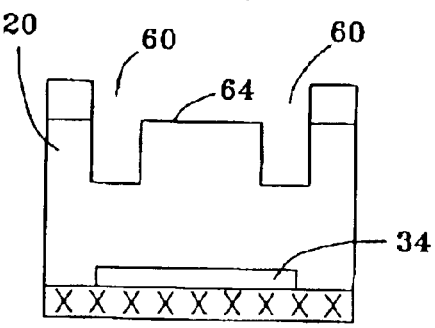

In the process represented in FIGS. 6 through 10, FIG. 6 schematically represents the sensor substrate 20 as it appears after completion of the CMOS process, during which the signal conditioning circuitry 14 was formed. The substrate 20 is circuit side-down in comparison to FIG. 1 in preparation for etching of the cavity 32. For convenience, other than the thermal oxide layer 34, the various dielectric and metallization layers of the sensor 110 (e.g., layers 24, 36, 38, 40, 42, 44, 46, 48 and 50) are not shown in any detail. The first step in forming the black silicon absorber 52 is represented in FIG. 7, which shows a mask 58 applied and patterned on the substrate 20, through which a trench 60 is etched into the substrate 20 as shown in FIG. 8. The trench 60 corresponds to the perimeter of the cavity 32 to be formed in the substrate 20. As noted previously, a preferred technique for this and subsequent etches is DRIE, though simple dry etching could also be used. After this initial etch, the mask 58 is removed and a second mask 62 is applied and patterned to form an opening that surrounds the trench 60, leaving exposed the trench 60 and a substrate surface region 64 surrounded by the trench 60 as shown in FIG. 9. The result of simultaneously dry etching (again, preferably DRIE) the exposed trench 60 and surface region 64 is represented in FIG. 10, wherein the trench 60 now extends to the thermal oxide layer 34 that serves as the etch stop for the dry etch process. In contrast, the etching process has removed much but not all of the substrate 20 between the substrate surface region 64 and the thermal oxide layer 34. The absorber 52 and trench 60 represented in FIG. 10 are the result of initially using etch conditions in the DRIE reactor that are known to produce clean and well-defined trenches with vertical side walls, until the etch stops at the etch-stop (thermal oxide) layer 34 to complete the trench 60. At this point, the trench 60 surrounds a remaining portion of the substrate 20 at the location where the absorber 52 is to be formed. The conditions in the DRIE reactor are then switched to those known in the art to cause black silicon formation, with the result that the black silicon absorber 52 is formed from the remaining substrate material. The trench 60 defines a thermal isolation trench surrounding black silicon absorber 52.

Figure 11:
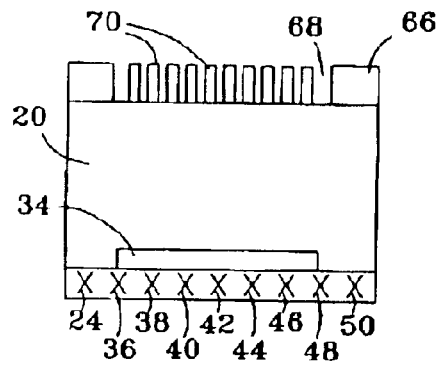
FIGS. 11 and 12 represent two steps of an alternative series of processing steps in the fabrication of the sensor represented in FIG. 5.
Figure 12:
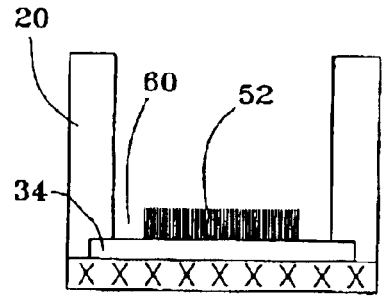

The absorber 52 and trench 60 shown in FIG. 12 is essentially identical to those of FIG. 10. However, as represented in FIG. 11, the process used to form the absorber 52 and trench 60 differs. In FIG. 11, a single mask 66 is patterned to have an outer continuous opening 68 for forming the trench 60 (and therefore defining the perimeter of the cavity 32), as well as a matrix of smaller openings 70 above the region of the silicon substrate 20 in which the absorber 52 is to be formed. As represented in FIG. 12, an etch is then performed, during which the etch proceeds more rapidly through the opening 68 than through the smaller openings 70. The etch is continued until the etch through the opening 68 encounters the etch-stop (thermal oxide) layer 34, at which point the trench 60 is defined and surrounds a remaining portion of the substrate 20 at the location where the absorber 52 is to be formed. The etch conditions are then altered from those that produce clean and well-defined trenches with vertical side walls (e.g., trench 60) to etch conditions known in the art to cause black silicon formation. As a result, the trench 60 is well defined and highly controlled as compared to the trenches etched through the smaller openings 70 in the remainder of the silicon substrate 20 surrounded by the trench 60, resulting in the formation of the black silicon absorber 52.

While the invention has been described in terms of a preferred embodiment, it is apparent that other forms could be adopted by one skilled in the art. For example, the process is applicable to micromachined devices other than the thermopile infrared sensors 10 and 110 shown in the Figures, and appropriate materials could be substituted for those noted. Accordingly, the scope of the invention is to be limited only by the following claims.

What is claimed is:

1. A process of fabricating a circuit structure having a micromachined member, the process comprising the steps of:
  forming a circuit device on a substrate by processing steps that include forming multiple dielectric layers and at least one conductive layer on the substrate, the multiple dielectric layers comprising an oxide layer on a surface of the substrate and at least two dielectric layers that are in tension, the at least one conductive layer being between the at least two dielectric layers; and then
  dry etching a surface of the substrate to form a cavity therein and thereby delineate the micromachined member and a frame surrounding the micromachined member, the dry etching step terminating at the oxide layer, the micromachined member comprising the multiple dielectric layers and the at least one conductive layer.

2. The process according to claim 1, wherein the micromachined member is a diaphragm having a perimeter supported by the frame.

3. The process according to claim 2, wherein the diaphragm has a first surface for receiving thermal radiation and a sensing layer that contains at least a pair of interlaced thermopiles, each thermopile comprising a sequence of thermocouples, each thermocouple comprising dissimilar electrically-resistive materials that define hot junctions located on the diaphragm and cold junctions located on the frame, the at least one conductive layer defining metal conductors that electrically connect the thermopiles to the circuit device.

4. The process according to claim 3, further comprising the step of forming a metal body so as to be between the at least two dielectric layers and within the diaphragm for reflecting thermal energy through at least one of the multiple dielectric layers toward the hot junctions of the thermopiles.

5. The process according to claim 3, further comprising the step of forming a metal rim so as to be within the diaphragm, overlapping a boundary between the diaphragm and the frame so as to be aligned with an edge defined by the cavity in the substrate, surrounding the hot junctions of the thermopiles, and between the hot and cold junctions of the thermopiles, the metal body serving to equalize thermal energy at the cold junctions.

6. The process according to claim 3, wherein one of the dissimilar electrically-resistive materials is p-type doped polysilicon.

7. The process according to claim 1, wherein the cavity has a rectangular shape with rounded corners.

8. The process according to claim 1, wherein at least one dielectric layer of the multiple dielectric layers is formed of an infrared-absorbing material chosen from the group consisting of an oxynitride or a tetra-ethyl-ortho-silicate based oxide.

9. The process according to claim 1, wherein the at least two dielectric layers in tension comprise a nitride layer and an oxynitride layer.

10. The process according to claim 1, wherein the dry etching step comprises simultaneously defining an infrared-absorbing body within the cavity and on the micromachined member.

11. The process according to claim 10, wherein the dry etching step comprises:
  applying a mask to the surface of the substrate;

defining an opening in the mask;

dry etching the substrate through the opening in the mask using first etch conditions to define a trench surrounding a surface region of the substrate that remains unetched as a result of being protected by the mask;

removing the mask; and then dry etching the trench and the surface region using etch conditions different than the first etch conditions until the trench stops at the oxide layer, a portion of the substrate remaining in the cavity to define the infrared-absorbing body surrounded by the trench.

12. The process according to claim 10, wherein the dry etching step comprises:

applying a mask to the surface of the substrate;

defining a first opening in the mask and a plurality of second openings in the mask that are smaller than the first opening, the first opening being continuous and surrounding the plurality of second openings; and then dry etching the substrate through the first and second openings in the mask using first etch conditions to define a trench that stops at the oxide layer and then using second etch conditions different than the first etch conditions to form the infrared-absorbing body surrounded by the trench.

13. A process of fabricating an infrared sensor comprising a circuit device and a diaphragm on a single semiconductor substrate that is not heavily doped, the process comprising the steps of:

forming the circuit device on the substrate by processing steps that include forming a thermal oxide layer on a surface of the substrate, forming a first tensioned dielectric layer on the thermal oxide layer, forming a thermal sensing layer over the first tensioned dielectric layer, forming at least a first conductive layer over the thermal sensing layer, and then forming a second tensioned dielectric layer so that the first conductive layer is between the first and second tensioned dielectric layers; and then dry etching a surface of the substrate to form a cavity therein and thereby delineate the diaphragm and a frame surrounding the diaphragm, the dry etching step terminating at the thermal oxide layer, the diaphragm comprising the thermal oxide layer, the first and second tensioned dielectric layers, and the first conductive layer.

14. The process according to claim 13, wherein the diaphragm has a first surface for receiving thermal radiation and the sensing layer comprises at least one thermopile comprising a sequence of thermocouples, each thermocouple comprising dissimilar electrically-resistive materials that define hot junctions located on the diaphragm and cold junctions located on the frame, the first conductive layer defining metal conductors that electrically connect the thermopiles to the circuit device.

15. The process according to claim 13, wherein one of the dissimilar electrically-resistive materials is p-type doped polysilicon.

16. The process according to claim 13, wherein the cavity has a rectangular shape with rounded corners.

17. The process according to claim 13, wherein one of the first and second tensioned dielectric layers is formed of a nitride and one of the first and second tensioned dielectric layers is formed of an oxynitride.

18. The process according to claim 13, wherein the first tensioned dielectric layer is formed of nitride and the second tensioned dielectric layer is formed of an oxynitride layer.

19. The process according to claim 13, wherein the dry etching step comprises:

applying a mask to a surface of the substrate opposite the circuit device;

defining an opening in the mask;

dry etching the substrate through the opening in the mask using first etch conditions to define a trench surrounding a surface region of the substrate that remains unetched as a result of being protected by the mask;

removing the mask; and then dry etching the trench and the surface region using etch conditions different than the first etch conditions until the trench stops at the oxide layer, a portion of the substrate remaining in the cavity to define an infrared-absorbing body surrounded by the trench.

20. The process according to claim 13, wherein the dry etching step comprises:

applying a mask to a surface of the substrate opposite the circuit device;

defining a first opening in the mask and a plurality of second openings in the mask that are smaller than the first opening, the first opening being continuous and surrounding the plurality of second openings; and then dry etching the substrate through the first and second openings in the mask using first etch conditions to define a trench that stops at the oxide layer and then using second etch conditions different than the first etch conditions to form the infrared-absorbing body surrounded by the trench.

* * * * *